US00RE36404E

United States Patent [19]

Kameda et al.

[11] E Patent Number: Re. 36,404

[45] Reissued Date of Patent: Nov. 23, 1999

[54] SEMICONDUCTOR MEMORY DEVICE FOR USE IN APPARATUS REQUIRING HIGH-SPEED ACCESS TO MEMORY CELLS

[75] Inventors: Yasushi Kameda, Yokosuka; Kenichi Nakamura, Sumida-Ku; Hiroshi Takamoto, Nerima-Ku; Takayuki Harima, Kawaguchi; Makoto Segawa, Yokohama, all of Japan

[73] Assignee: Kabushiki Kaisha Toshiba, Kawasaki, Japan

[21] Appl. No.: 08/970,780

[22] Filed: Nov. 14, 1997

Related U.S. Patent Documents

Reissue of:

[64] Patent No.: 5,467,317
Issued: Nov. 14, 1995
Appl. No.: 08/328,049
Filed: Oct. 24, 1994

U.S. Applications:

[63] Continuation of application No. 07/905,416, Jun. 29, 1992, abandoned.

[30] Foreign Application Priority Data

Jan. 27, 1991 [JP] Japan ..... 3-157112

[51] Int. Cl.[6] ..... G11C 7/00

[52] U.S. Cl. ..... 365/230.06; 365/230.03; 365/189.05; 327/433; 327/434

[58] Field of Search ..... 365/230.06, 230.03, 365/177, 189.05, 189.11, 189.09; 327/433, 434

[56] References Cited

U.S. PATENT DOCUMENTS

| | | | |
|---|---|---|---|
| 4,761,769 | 8/1988 | Saito | 365/203 |
| 4,791,382 | 12/1988 | Shiomi et al. | 330/254 |
| 4,796,234 | 1/1989 | Itoh et al. | 365/227 |
| 4,899,066 | 2/1990 | Ikawa et al. | 365/203 |
| 5,042,010 | 8/1991 | Ogiue et al. | 365/189.05 |

FOREIGN PATENT DOCUMENTS

| | | |
|---|---|---|
| 61-20292 | 1/1986 | Japan . |
| 61-20293 | 1/1986 | Japan . |
| 1245489 | 9/1989 | Japan . |

*Primary Examiner*—Vu A. Le
*Attorney, Agent, or Firm*—Foley & Lardner

[57] ABSTRACT

A semiconductor memory device including a plurality of cell array sections each having a plurality of memory cells disposed in a matrix form, the plurality of cell array sections being juxtaposed in a row direction. Main word lines, are each provided in common for all of the plurality of cell array sections in each row, a row select signal being applied to each main word line. Section word lines are connected to memory cells, in each cell array section at each row, for activating the memory cells. Section select lines are provided for each cell array section, a section selection signal being applied to each section select line. Logical circuits are provided for each cell array section, each logical circuit being connected to each main word line and the section select line, executing a logical operation between the row select signal and the section select signal, and activating the section select line when the logical operation result satisfies a predetermined logical condition. Each logical circuit includes a first inverter, a CMOS type second inverter and an N-channel transistor. Each main word line is connected to the input terminals of the first and second inverters. Each section select line is connected to the drain of the N-type transistor and the source of a P-channel transistor of the second inverter. The gate of the N-channel transistor is connected to the output terminal of the first inverter and each section word line is connected to the source of the N-channel transistor and the output terminal of the second inverter. Bit lines are connected to each memory cell for receiving data from a selected memory cell and outputting the data.

20 Claims, 9 Drawing Sheets

SEMICONDUCTOR MEMORY DEVICE FOR USE IN APPARATUS REQUIRING HIGH-SPEED ACCESS TO MEMORY CELLS

Matter enclosed in heavy brackets [ ] appears in the original patent but forms no part of this reissue specification; matter printed in italics indicates the additions made by reissue.

This application is a continuation of application Ser. No. 07/905,416, filed Jun. 29, 1992, now abandoned.

FIELD OF THE INVENTION

The present invention relates to a semiconductor memory device, and more particularly to a semiconductor memory device suitable for use with apparatuses requiring high speed access to memory cells.

BACKGROUND OF THE INVENTION

FIG. 1 is a block diagram showing a conventional semiconductor integrated circuit FIG. 1, memory cells (MC) 3 are selected by a word line 2, and one of them is accessed by complementary bit lines L Bit lines 1 are connected to column switches 5 which are turned on/off by a column switch control (CC) signal 4. Each memory cell 3 is connected to bit lines 1 and a word line 2 as shown in the circuit diagram of FIG. 2. One of memory cells 3 selected by the word line 2 is accessed by the bit lines 1.

The circuit arrangement shown in PIG. 1 is generally called a word line control system. With this system, when one word line 2 is selected, all memory cells 3 connected to this word line 2 are activated Therefore, there arises the problem of a large load and hence large consumption current.

A circuit eliminating the above problem is known which has the structure as shown in FIG. 3. In this circuit, memory cells are divided into blocks of several memory cell array sections 9. An access signal from a main word line 6 is selected by using a section select line 8, and connected to a section word line 7 provided for each array section 9. As shown in the block diagram of FIG. 4, in each array section 9, a NOR gate executes a logical operation between signals on the main word line 6 and the section select line 8, to select a particular section word line 7. Memory cells 3 selected by the section word line 7 are being disposed in a similar manner as shown in FIG. 1. Each memory cell 3 is accessed by controlling column switches connected to the bit lines 1 upon reception of a column switch control signal 4.

With the above-described arrangement, the section word line 7 in each memory cell array section 9 is selected in accordance with the logical condition between the main word line 6 and section select line 8. Memory cells 3 connected only to the selected section word line 7 are activated, allowing reduced load and consumption current.

Conventional semiconductor integrated circuits have been structured in the manner just described above. Therefore, in order to select a particular one of section word lines 7 of each array section 9, it is necessary to provide logical circuits for obtaining logical conditions between the main word line 6 and section selection lines 8. These logical circuits are connected to the section select lines 8, posing another problem of a large load on the section selection line 8. The section select line 8 is usually connected to the gates of transistors each of which outputs a select signal to the corresponding section word line 7. However, the gate capacitance of such a transistor is substantially large, and the select speed is lowered essentially. Particularly in the case where the section select line 8 is driven by a CMOS inverter, the load becomes excessively heavy, resulting in a low access speed.

SUMMARY OF THE INVENTION

The present invention has been made in consideration of the above-described circumstances. It is an object of the present invention to provide a semiconductor memory device allowing a high speed access to memory cells, by obtaining a signal to be supplied to the gate of a transistor driving each section word line, from a BiCMOS inverter with a large drive current capacity.

According to the present invention, a logical circuit executes a logical operation of signals on a main word line and a section select line. An output from the logical circuit selects a particular section word line of each array section. In each logical circuit, the section select line is not directly connected to the gate of a transistor. Therefore, a load of the section select signal is small.

Furthermore, a section select signal supplied to each section select line is obtained from a BiCMOS inverter, at a speed higher than that when the section select signal is obtained from a CMOS inverter. A lowered high level output of the BiCMOS inverter is raised to a power source voltage $V_{CC}$ by a P-channel transistor, and a degraded discharge speed can be prevented by using a delay circuit.

As described above, according to the present invention, in a semiconductor memory device whose memory cells are divided into a plurality of memory cell array sections, a section word line in each array section is selected by a main word line and section select line, without directly connecting the section select line to the gate of a transistor connected to the section word line, thereby reducing the load. Furthermore, a BiCMOS structure is used for driving a section select line, improving a drive power and realizing high speed memory access.

DESCRIPTION OF THE PREFERRED EMBODIMENTS

Preferred embodiments of the present invention will be described with reference to the accompanying drawings.

Figure 5:
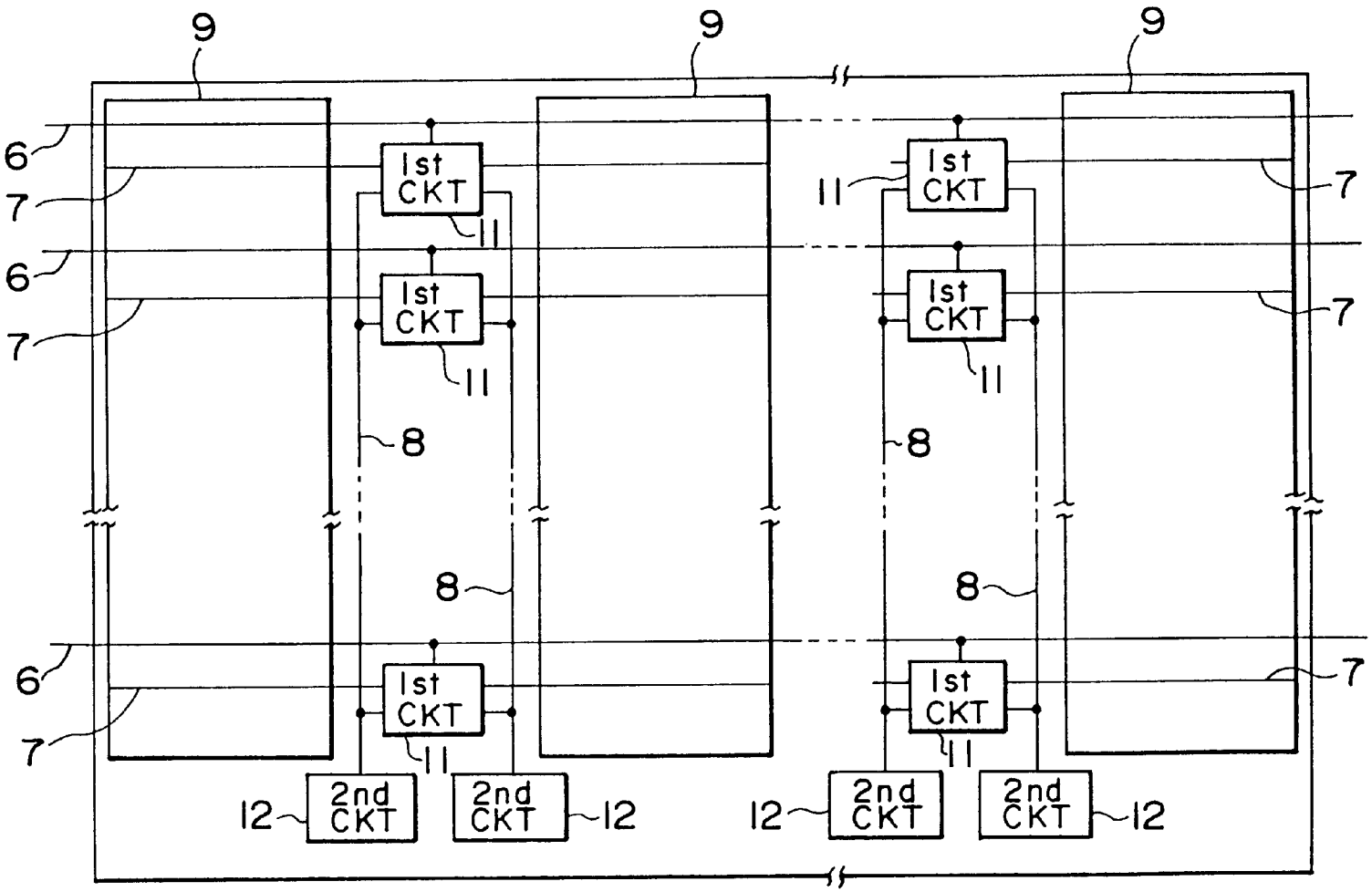
FIG. 5 is a block diagram showing the outline of a first embodiment according to the present invention.

FIG. 5 is a block diagram showing a semiconductor memory device according to the present invention. As shown in FIG. 5, a main word line 6 and section select lines 8 are connected to a first circuit 11. A section word line 7 extends out of the first circuit 11. The section select lines 8 extend out of second circuit 12.

Figure 6:
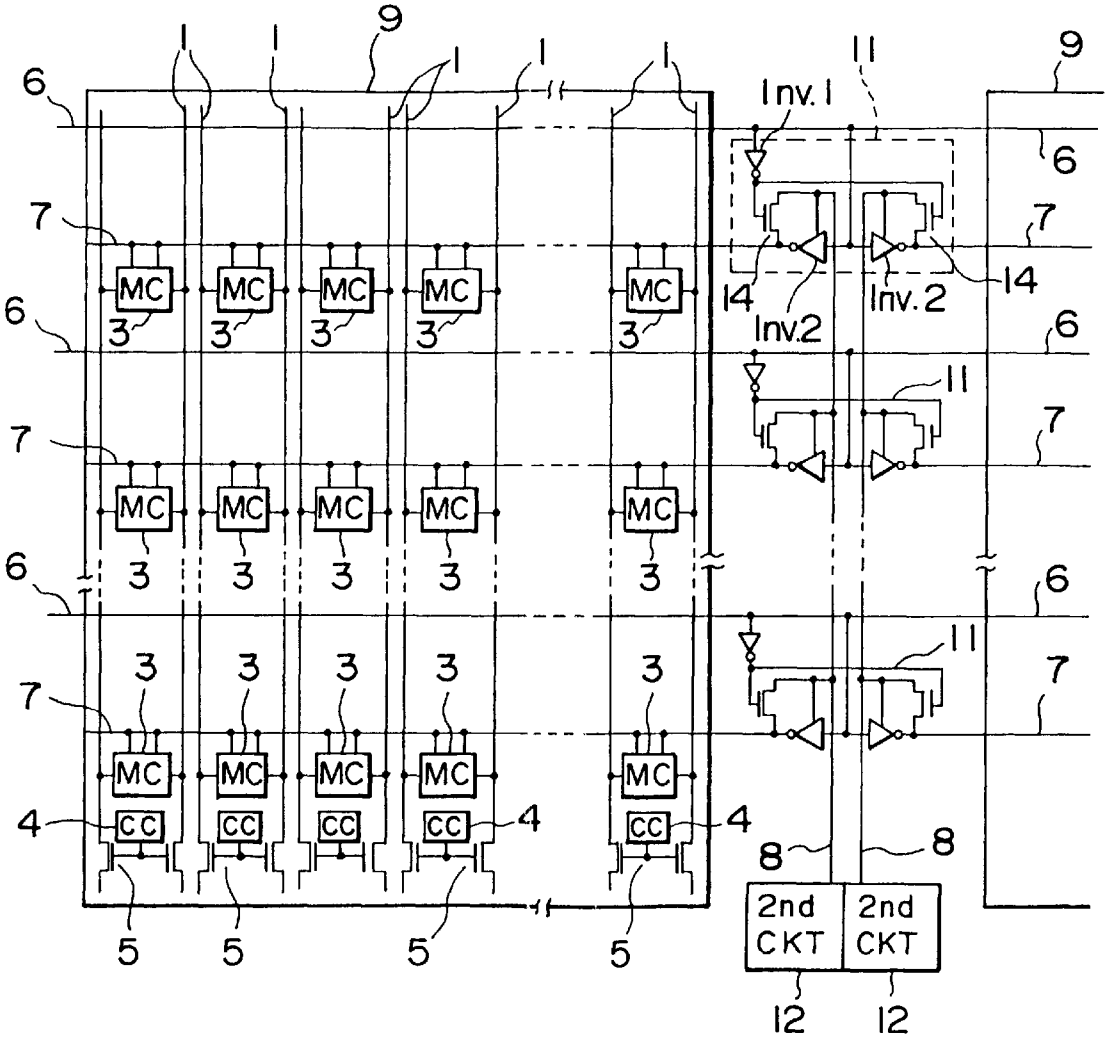
FIG. 6 is a circuit diagram showing the internal structures of the memory cell array section and the first circuit shown in FIG. 5.
Figure 10:
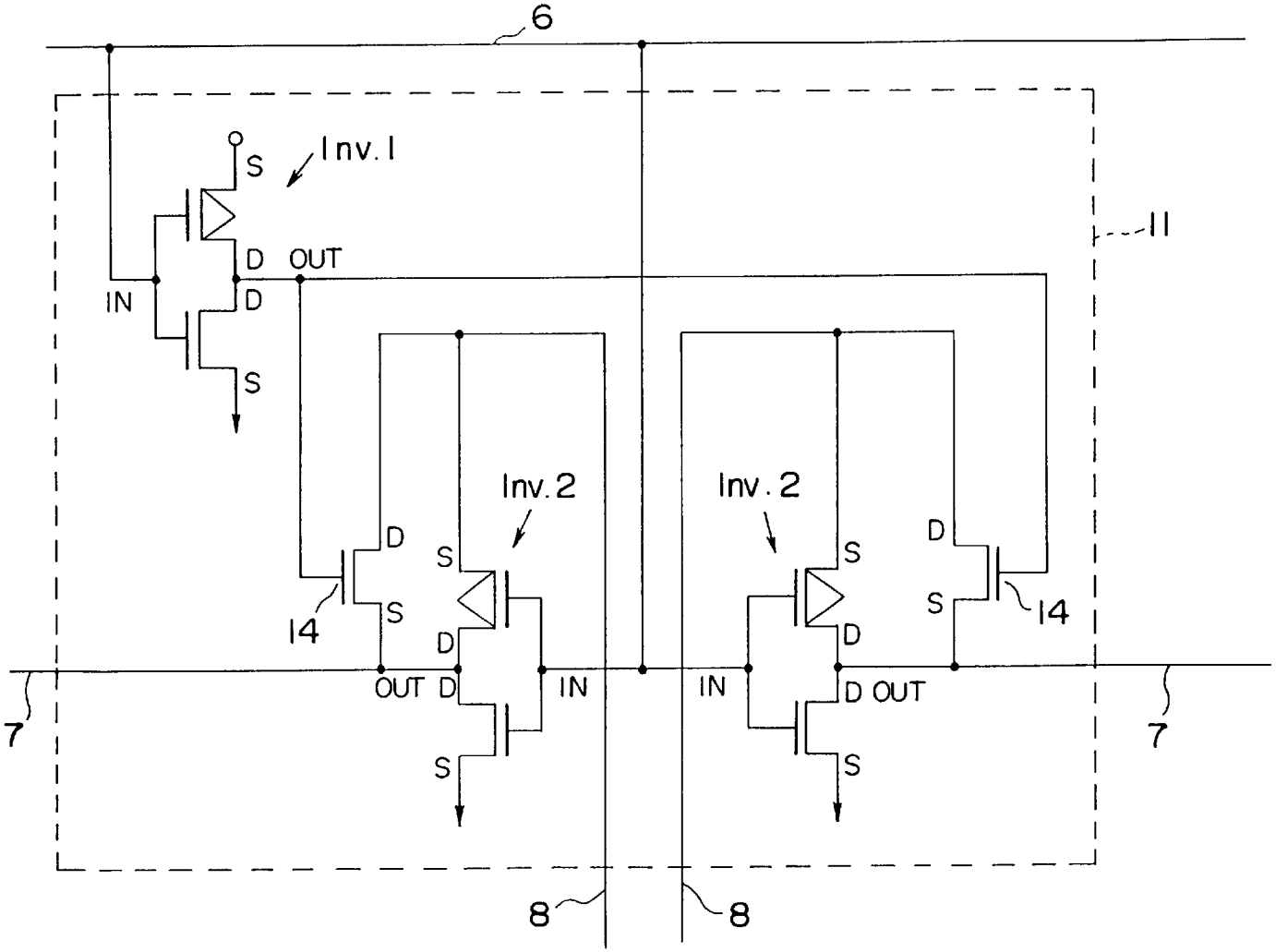
FIG. 10 is a circuit diagram showing examples of the inverts Inv 1 and Inv 2 shown in FIG. 6.

FIG. 6 is a detailed circuit showing part of the device, i.e., the internal circuit of the cell array section 9 and first circuit 11. As seen from FIG. 6, the man word line 6 is connected to first and second inverters Inv 1 and Inv 2 of the first circuit 11. The section select line 8 is connected to the drain of an N-type transistor 14 and the source of a P-type transistor constituting the second inverter Inv 2 (refer to FIG. 10). The gate of the N-type transistor 14 is connected to the output of the inverter Inv 1, and the source thereof is connected to the section word line 7. The output terminal of the inverter Inv 2 is connected to the section word line 7. Each section select line 8 is, therefore, not connected directly to the gates of the transistors driving the section word line 7, thereby providing a very small load. The detailed circuit of the inverters Inv 1 and Inv 2 is shown in FIG. 10.

The operation will be described. It is assumed that the main word line 6 follows negative logic, and the section select line 8 follows positive logic. Namely, the section word line 7 is activated to a high level when the main word line 6 takes a low level and the section select line 8 takes a high level. It is to be noted that the section select line 8 is not connected to the gate of the transistor used for driving the section word line 7. Therefore, it is possible to provide a very small load and a high speed access.

Figure 7:
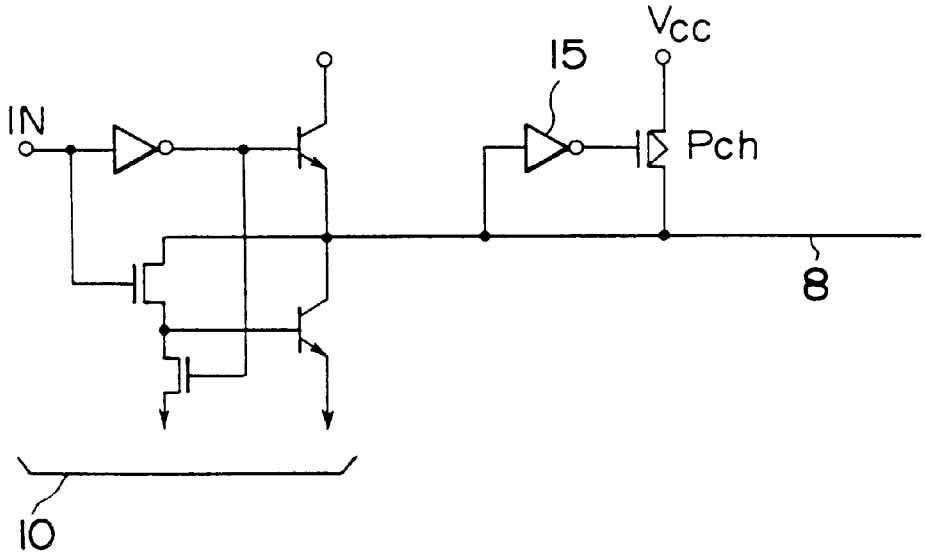
FIG. 7 is a circuit diagram showing an example of the second circuit shown in FIG. 5.

FIG. 7 is a detailed circuit diagram showing an example of the second circuit 12 which outputs a section select signal to the section select line 8. A signal IN inputted for section selection is inverted by a BiCMOS inverter 10, and outputted onto the section select line 8. An output from the BiCMOS inverter 10 takes a level $V_{B1}$ or $(V_{CC}-V_{B1})$ where $V_{CC}$ is a power source voltage and $V_{B1}$ is a saturation voltage. A high level output at the BiCMOS inverter is lowered by $V_{B1}$. In order to raise the high level output to $V_{CC}$, the section select line 8 is connected to the gate of a P-channel transistor Pch via an inverter 15, the source of the transistor Pch being connected to the power source voltage $V_{CC}$.

The operation of the second circuit constructed as shown in FIG. 7 will be described under the condition that an output of the BiCMOS inverter 10 takes a low level. In this case, a high level is applied to the gate of the P-channel transistor Pch via the inverter 15, thereby maintaining the P-channel transistor Pch to turn off and the section select line 8 to be set to the low level $(=V_{B1})$. Under this state, when the output of the BiCMOS inverter 10 changes to the high level, a low level is applied to the gate of the P-channel transistor Pch via the inverter 15, thereby turning on the transistor Pch. The section select line 8 is thus connected to the power source voltage $V_{CC}$ and raised to this level $V_{CC}$.

Alternatively, when the output of the BiCMOS inverter 10 changes from the high level to the low level, the BiCMOS inverter 10 operates to discharge the section select line 8, and at the same time turns off the P-channel transistor Pch via the inverter 15, allowing to continue the discharge of the section select line 8.

Figure 8:
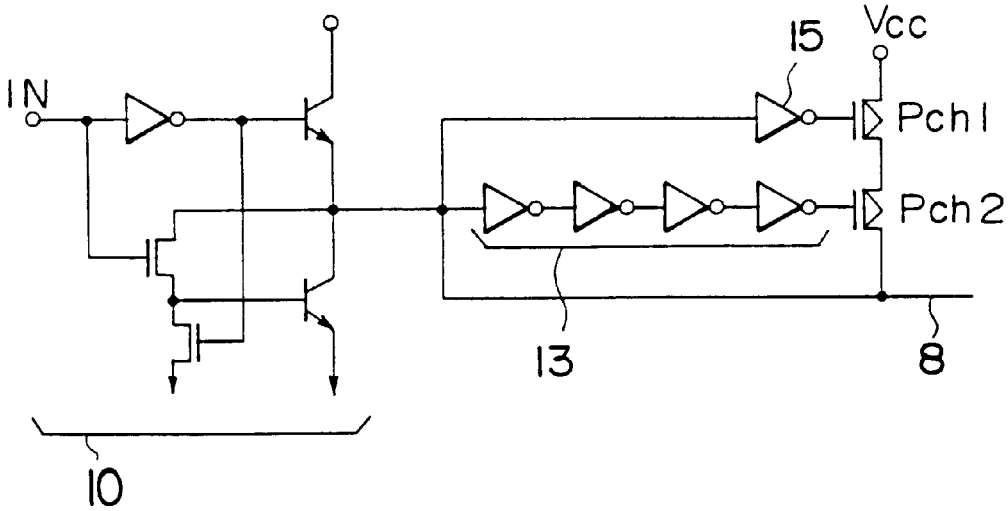
FIG. 8 is a circuit diagram showing another example of the second circuit shown in FIG. 5.

FIG. 8 is a circuit diagram showing another example of the second circuit for outputting a select signal to the section select line 8. This example provides an improved discharge speed when an output of the BiCMOS inverter 10 changes from the high level to the low level. As shown in FIG. 8, a signal IN inputted for section selection is inverted by a BiCMOS inverter 10, and outputted onto the section select line 8. In order to raise the output high level of the BiCMOS inverter 10 to the level $V_{CC}$, there is provided a first P-channel transistor Pch 1 whose source is connected to the power source voltage $V_{CC}$ and whose gate is inputted with a signal level on the section select line 8 inverted by an inverter 15. The drain of a first P-channel transistor Pch 1 is connected to the source of the second P-channel transistor Pch 2 whose drain is connected to the section select line 8. The gate of the second P-channel transistor Pch 2 is connected to the output terminal of a delay circuit 13 having a plurality stage of inverters for delaying an output of the BiCMOS inverter 10.

Next, the operation of this second circuit will be described. First, while the output of the BiCMOS inverter 10 takes the low level, the first and second P-channel transistors Pch 1 and Pch 2 are being turned off/on, respectively. The section select line 8 is therefore taking the low level $(=V_{B1})$. In this state, when the output of the BiCMOS inverter 10 changes to the high level, the gate of the first P-channel transistor Pch 1 takes the low level and turns on. However, the delay circuit 13 keeps the gate of the second P-channel transistor Pch 2 at the low level. Therefore, the section select line 8 is connected to the power source voltage $V_{CC}$ and raised to this level $V_{CC}$. Thereafter, a signal delayed by the delay circuit 13 is applied to the gate of the second P-channel transistor Pch 2 which is then turned off by this signal applied to its gate. At this time, the section select line 8 enters a floating state and holds the $V_{CC}$ level. Alternatively, when the output of the BiCMOS inverter 10 changes from the high level to the low level, the first P-channel transistor Pch 1 immediately turns off, and the second P-channel transistor Pch 2 turns on after the delay time of the delay circuit 13. As a result, the section select line 8 discharges rapidly.

Figure 9:
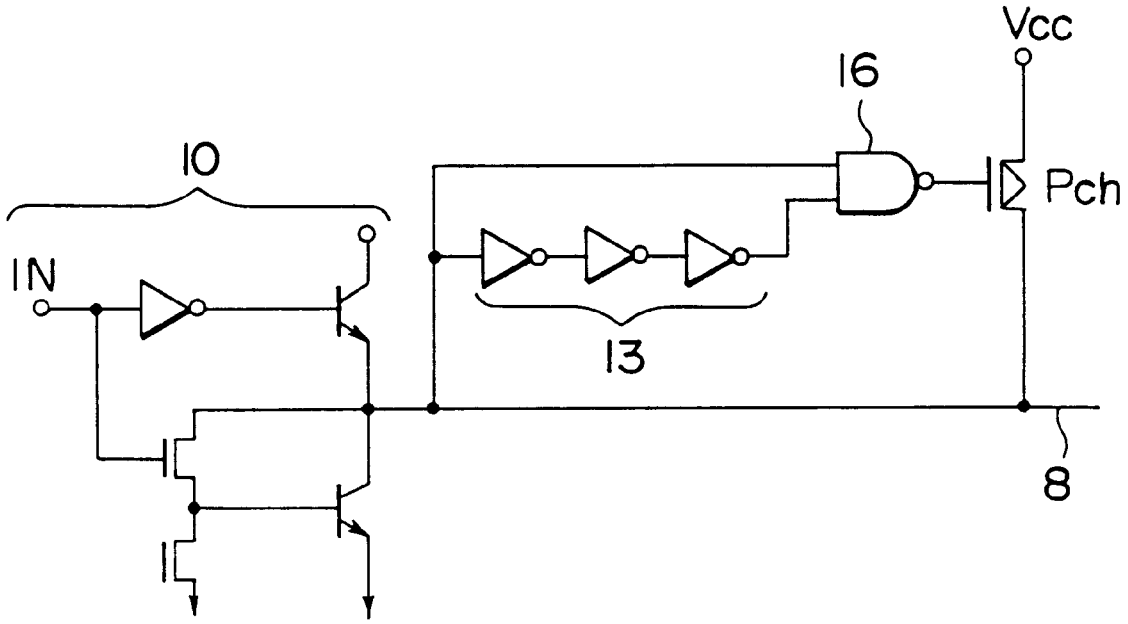
FIG. 9 is a circuit diagram showing another example of the second circuit shown in FIG. 5.

FIG. 9 is a circuit diagram showing another example of the second circuit 12 for outputting a section select signal to the section select line 8. In this example, one P-channel transistor is used for charging the section select line 8 up to the $V_{CC}$ level. As shown in FIG. 9, a signal IN inputted for section selection is inverted by a BiCMOS inverter 10, and outputting onto the section select line 8. In order to raise the output high level of the BiCMOS inverter 10 to the level $V_{CC}$, there is provided a P-channel transistor Pch whose source is connected to the power source voltage $V_{CC}$ and whose gate is inputted with an output of a logical gate 16. This logical gate 16 is inputted with an output of the BiCMOS 10 and an output of a delay circuit 13 having a plurality stage of inverters, the delay circuit 13 delaying the output of the BiCMOS inverter 10. A NAND operation between both the inputs is applied to the gate of the P-channel transistor Pch.

In operation of this second circuit constructed as above, while the output of the BiCMOS inverter 10 takes the low level, the output of the delay circuit 13 is taking the low level and so the output of the logical gate 16 is taking the high level. With the high level applied to the gate of the P-channel transistor Pch, it is maintained turned off. The section select line 8 is therefore taking the low level $(=V_{B1})$. In this state, when the output of the BiCMOS inverter 10 changes to the high level, one input to the logical gate changes to the high level while maintaining the other input from the delay circuit 13 at the high level. The P-channel transistor Pch takes the low level at its gate and turns on. Therefore, the section select line 8 is connected to the power source voltage $V_{CC}$ and raised to the $V_{CC}$ level. On the other hand, while the output of the BiCMOS inverter 10 takes the high level, one input to the logical gate 16 is maintained to the low level of the output of the inverter 10 delayed by the delay circuit 13, and so the output of the logical gate 16 is maintained at the high level. With the high level gate input, the P-channel transistor Pch is being turned off. During this period, the section select line 8 enters the floating state and holds the $V_{CC}$ level. In this state, when the output of the BiCMOS inverter 10 changes from the high level to the low level, this second circuit operates as follows. The output of the logical gate 16 immediately takes the high level upon reception of the output from the BiCMOS inverter 10, and so the P-channel transistor Pch immediately turns off. The other input to the logical gate 16 takes the high level after the delay time of the delay circuit 13. However, the output state of the logical gate 16 will not change, so that the section select line 8 discharges rapidly.

Figure 1:
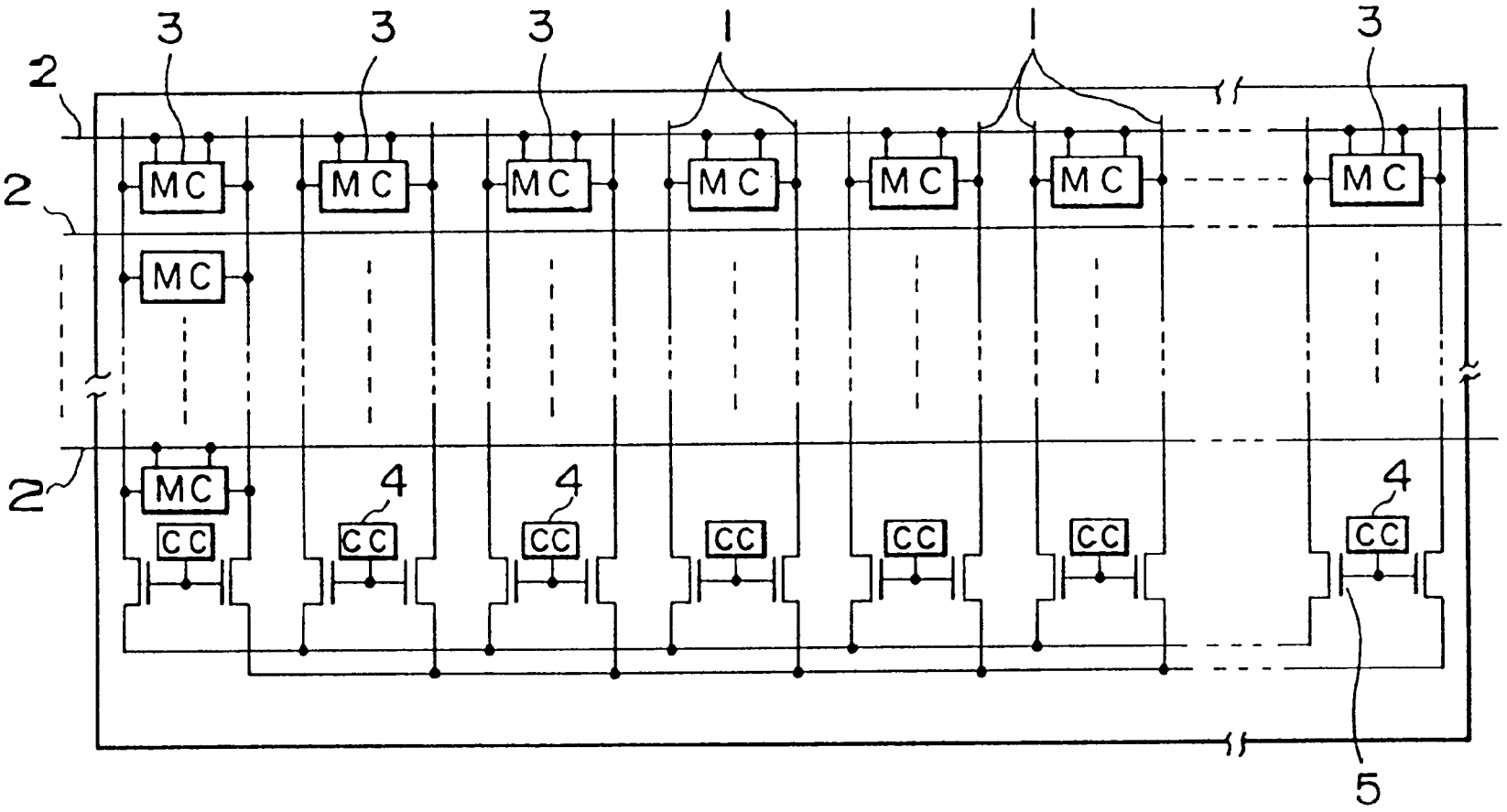
FIG. 1 PRIOR ART
FIG. 1 is a block diagram showing a conventional semiconductor memory device.
Figure 2:
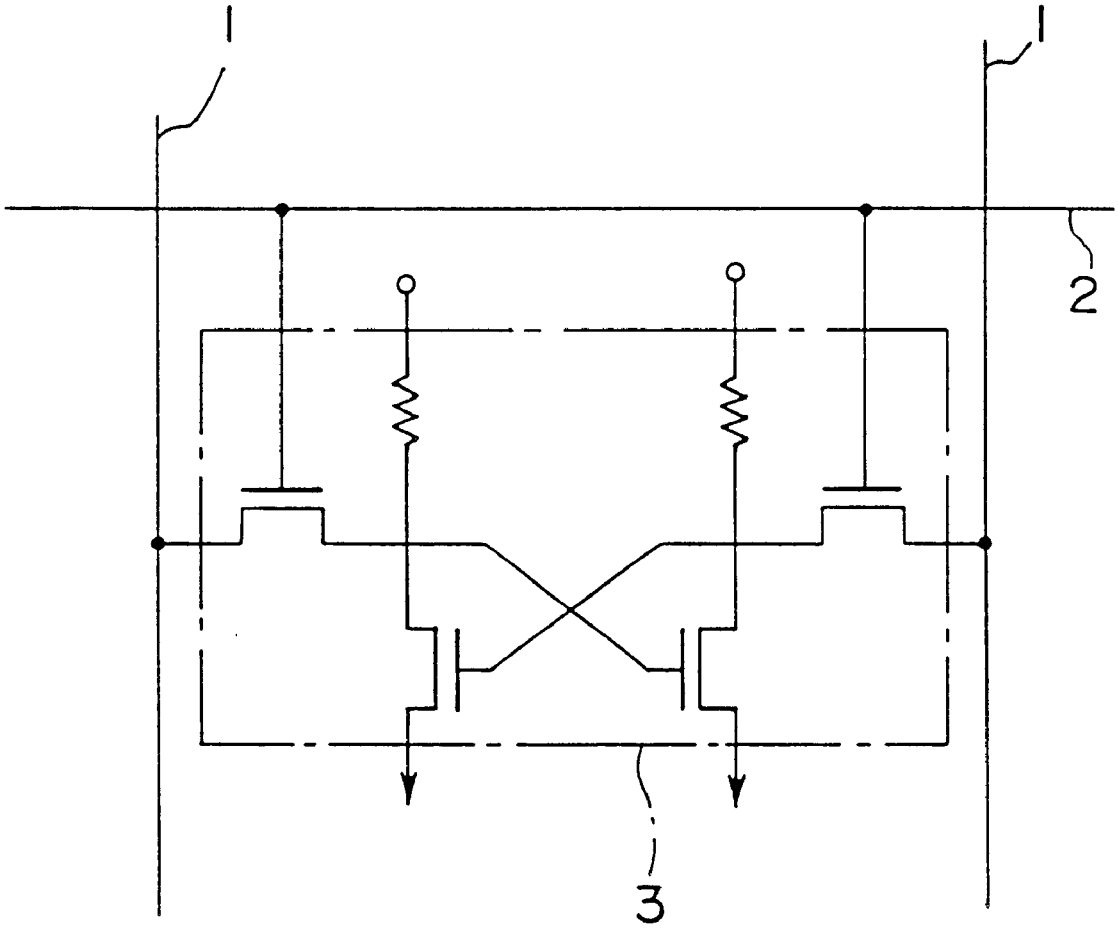
FIG. 2 PRIOR ART
FIG. 2 is a circuit diagram showing connections of a memory cell shown in FIG. 1 to a word line and bit lines.
Figure 3:
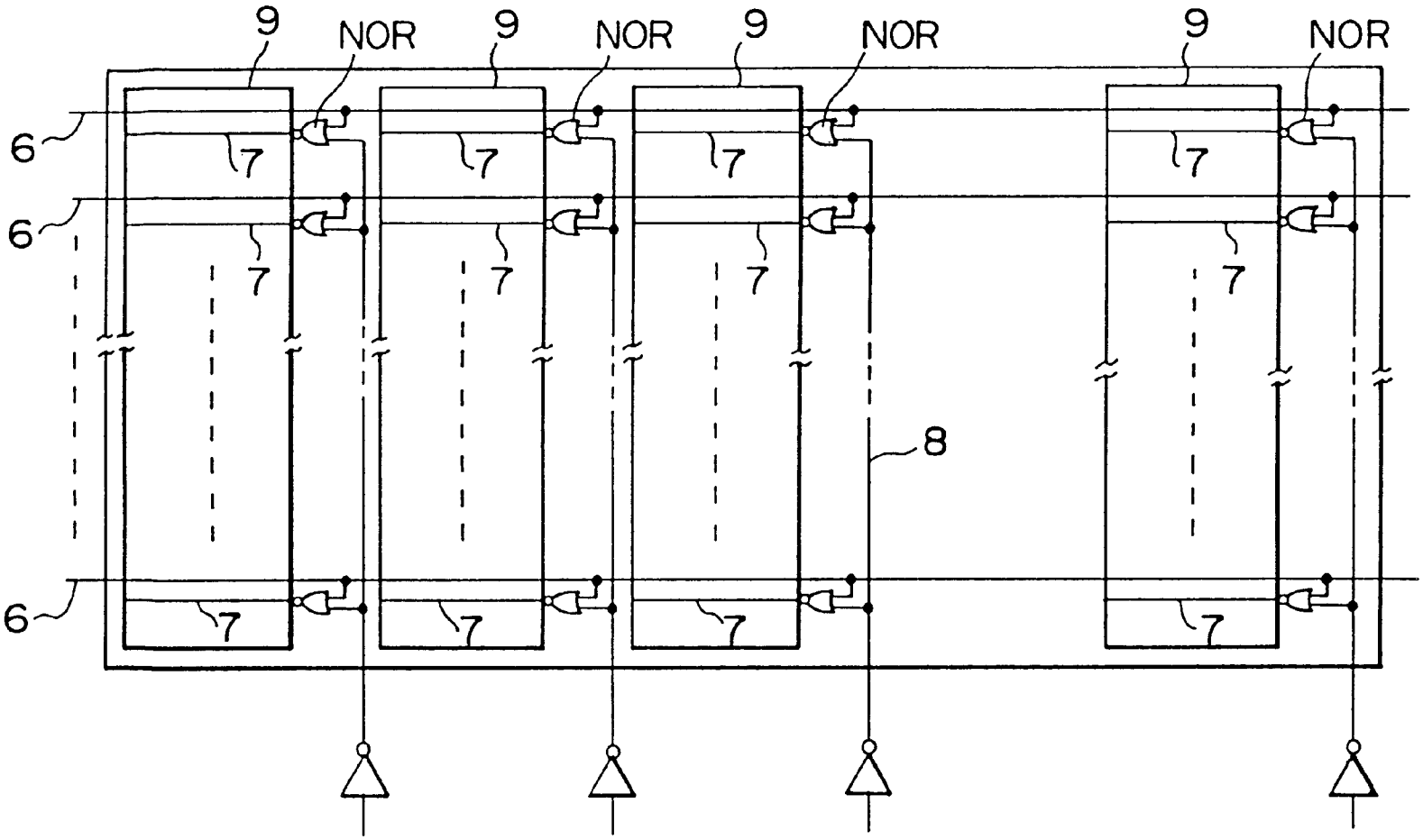
FIG. 3 PRIOR ART
FIG. 3 is a block diagram showing another conventional semiconductor memory device.
Figure 4:
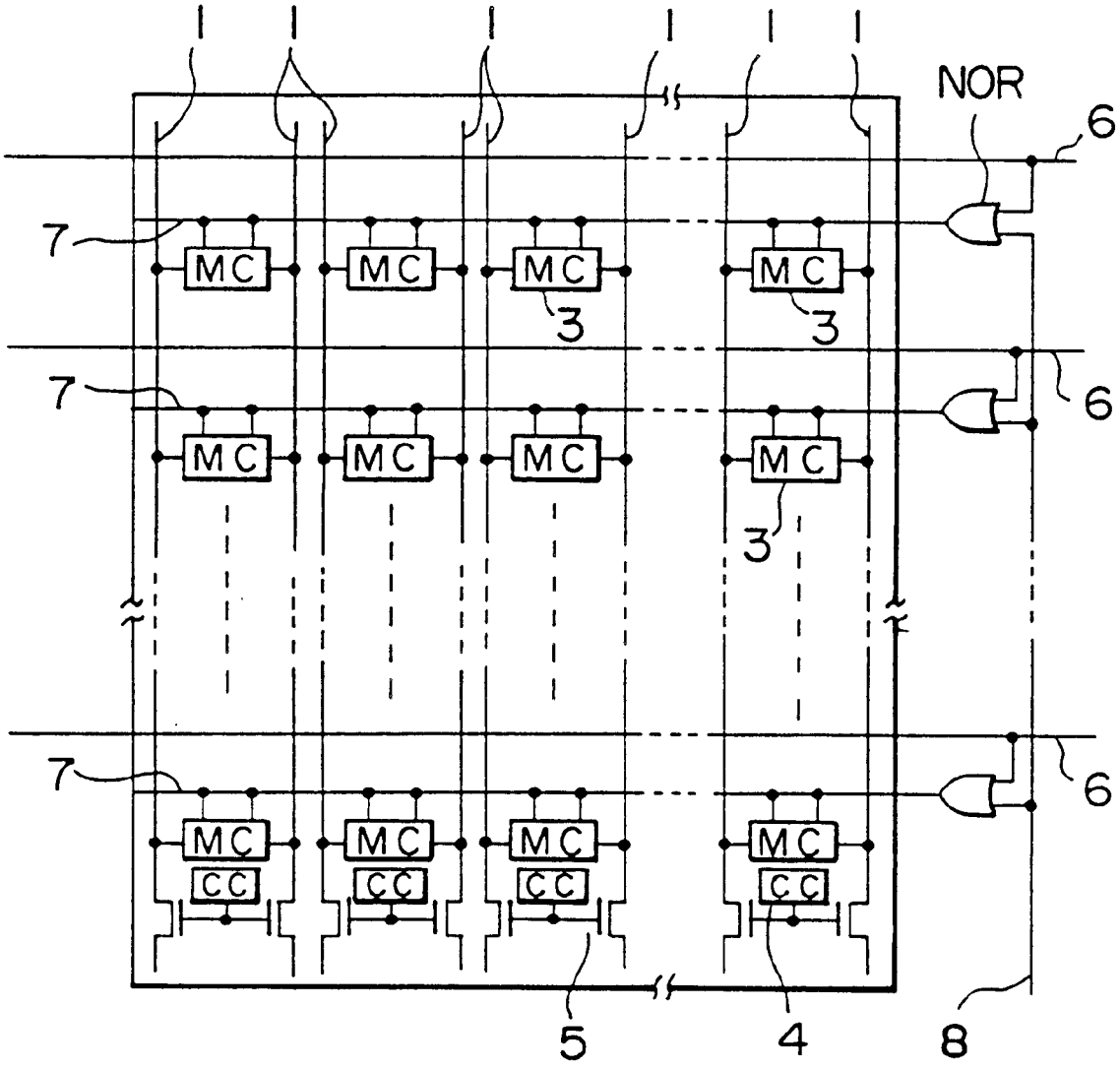
FIG. 4 PRIOR ART
FIG. 4 is a circuit diagram showing the structure of a memory cell array section shown in FIG. 3.

As stated above, the section selection line 8 is not connected to the gate of a transistor so that the load of the section select line 8 is only a junction capacitor, the load being reduced by an amount corresponding to the gate capacitor. In the conventional circuit shown in FIG. 4, the section select line 7 is charged through two small size P-channel transistors of the logical circuit NOR. In contrast, in the circuit shown in FIG. 6 for example, the section select line 8 is charged through the bi-polar transistor of the BiCMOS inverter of the second circuit 12 and the small P-channel transistor Pch of the inverter Inv 2 connected to the section word line 7. The circuit of the present invention can therefore provide a faster charge speed.

In the embodiment shown in FIG. 5 for example, the first circuit 1 is used in common for both the right and left memory cell arrays 9, 9. Namely, shown in FIG. 10, a single inverter Inv 1 for inverting the select signal on the main word line 6 is used for both the arrays, to reduce the number of transistors.

Furthermore, the section word line 7 is connected to the sources of the transistor 14 and the connecting middle point of the inverter Inv. 2, so that the diffusion layer can be used in common for both the logical circuits, thereby allowing to implement the invention circuit on a semiconductor chip with substantially the same area as conventional, irrespective of that the invention circuit is somewhat complicated.

In the second circuit 12 connected to the section select line 8, the BiCMOS inverter 10 allows a high speed discharge of the section select line when the output of the BiCMOS inverter 10 changes from the high level to the low level.

Still further, a P-channel transistors used for charging the section select line 8 to $V_{CC}$, and the output of the BiCMOS inverter 10 is used as an input signal to the P-channel transistor. Therefore, it is possible to set a potential of the section select line 8 at Vcc similarly as in the case where an output is obtained from a CMOS.

What is claimed is:

1. A semiconductor memory device comprising:

a plurality of sectional cell arrays arranged in a row direction and each having a plurality of memory cells arranged in a matrix pattern;

main word lines each provided in common for a row of all of said sectional cell arrays and responsive to a row select signal;

section word lines provided for each row of each of said sectional cell arrays and each of said section word lines connected to the corresponding memory cells arranged in each corresponding row of each of said sectional cell arrays, for activating the memory cells connected thereto;

first and second section select lines provided between a pair of said sectional cell arrays, and responsive to section select signals, a plurality of logical circuit groups each provided between a pair of said sectional cell arrays, and each having a plurality of logical circuits each connected to each row of said sectional cell arrays, for activating a section word line when a logical result of a row select signal and a section select signal satisfies a logical condition, each logical circuit including:

a common inverter provided in common for said pair of said sectional cell arrays; and a first circuit for activating a section word line of one of said pair of said sectional cell arrays and a second circuit for activating a section word line of the other of said pair of said sectional cell arrays, said first and second circuits being symmetrical with each other with respect to a column line;

said first circuit having a first CMOS-type inverter composed of series-connected P-type and N-type transistors, and a first N-type transistor; and said second circuit having a second CMOS-type inverter composed of series-connected P-type and N-type transistors, and a second N-type transistor;

said main word line being connected to said common inverter and to input terminals of the first and second CMOS-type inverters;

a first section select line being connected to a drain of the first N-type transistor and a source of the P-type transistor of the first inverter, and a second section select line being connected to a drain of the second N-type transistor and a source of the P-type transistor of the second inverter;

an output of said common inverter being connected to gates of the first and second N-type transistors; and a source of the first N-type transistor and an output terminal of the first CMOS-type inverter being connected to a section word line of one of the sectional cell arrays, and a source of the second N-type transistor and an output terminal of the second CMOS-type inverter being connected to a section word line of the other of the sectional cell arrays; and bit lines each connected to the memory cells, respectively, for receiving data from the selected memory cells and outputting the received data; and a plurality of section select signal output circuits for outputting said section select signals to each said section select line, each section select signal output circuit comprising a power supply circuit with a high driving capacity, wherein said power supply circuit is a BiCMOS logical circuit.

2. A semiconductor memory device according to claim 1, wherein said section select signal output circuit further comprising a compensating circuit for compensating a voltage outputted from said BiCMOS logical circuit by a value of a fall of potential.

3. A semiconductor memory device according to claim 2, said each section select signal output circuit having said BiCMOS logical circuit as said power supply circuit, an inverter and a P-channel transistor as said compensating circuit, an output terminal of said BiCMOS logical circuit being connected to said section select line, an input terminal of said inverter and the drain of said P-channel transistor, an output terminal of said inverter being connected to the gate of said P-channel transistor, and the source of said P-channel transistor being applied with a power source voltage.

4. A semiconductor memory device comprising:

a plurality of cell array sections, each having a plurality of memory cells disposed in a matrix form, said plurality of cell array sections being juxtaposed in a row direction;

main word lines, each provided in common for all of said plurality of cell array sections at each row, a row select signal being applied to each said main word line;

section word lines connected to said memory cells in each said cell array section at each row, for activating said memory cells;

section select lines provided for each said cell array section, a section selection signal being applied to each said section select line;

logical circuits provided for each said cell array section, each said logical circuit being connected to each said main word line and said section select line, said logical circuits executing a logical operation between said row select signal and said section select signal, and activating said section select line when said logical operation result satisfies a predetermined logical condition, each said logical circuit including a first inverter, a CMOS type second inverter and an N-channel transistor, each said main word line being connected to the input terminals of said first and second inverters, each said section select line being connected to the drain of said N-channel transistor and the source of a P-channel transistor of said second inverter, the gate of said N-channel transistor being connected to the output terminal of said first inverter, and each said section word line being connected to the source of said N-channel transistor and the output terminal of said second inverter;

bit lines connected to each memory cell for receiving data from a selected memory cell and outputting said data;

a plurality of section select signal output circuits for outputting said section select signal to each said section select line, each said section select signal output circuit comprising a power supply circuit with a high driving capacity, said power supply circuit being a BiCMOS logical circuit; and a compensating circuit in said section select signal output circuit which compensates for the voltage outputted from said BiCMOS logical circuit by a drop in potential;

each select signal output circuit having said BiCMOS logical circuit as said power supply circuit and said compensating circuit, said compensating circuit comprising an inverter, a delay circuit and serially connected first and second P-channel transistors, an output terminal of said BiCMOS logical circuit being connected to said section select line, an input terminal of said inverter and an input terminal of said delay circuit, an output terminal of said inverter being connected to the gate of said first P-channel transistor, an output terminal of said delay circuit being connected to the gate of said second P-channel transistor, the source of said first P-channel transistor being supplied with a power source voltage, and the drain of said second P-channel transistor being connected to said section select line.

5. A semiconductor memory device according to claim 4, wherein said delay circuit includes a plurality of serially connected inverters.

6. A semiconductor memory device comprising:

a plurality of cell array sections, each having a plurality of memory cells disposed in a matrix form, said plurality of cell array sections being juxtaposed in a row direction;

main word lines, each provided in common for all of said plurality of cell array sections at each row, a row select signal being applied to each said main word line;

section word lines connected to said memory cells in each said cell array section at each row, for activating said memory cells;

section select lines provided for each said cell array section, a section selection signal being applied to each said section select line;

logical circuits provided for each said cell array section, each said logical circuit disposed between a pair of cell array sections and connected to each said main word line and said section select line, said logical circuits executing a logical operation between said row select signal and said section select signal, and activating said section select line when said logical operation result satisfies a predetermined logical condition, each said logical circuit including a first inverter, a CMOS type second inverter and an N-channel transistor, each said main word line being connected to the input terminals of said first and second inverters, each said section select line being connected to the drain of said N-channel transistor and the source of a P-channel transistor of said second inverter, the gate of said N-channel transistor being connected to the output terminal of said first inverter, and each said section word line being connected to the source of said N-channel transistor and the output terminal of said second inverter;

bit lines connected to each memory cell for receiving data from a selected memory cell and outputting said data; and a plurality of section select signal output circuits for outputting said section select signal to each said section select line, each said section select signal output circuit comprising a power supply circuit with a high driving capacity, each said power supply circuit being a BiCMOS logical circuit:

each said section select signal output circuit comprising a compensating circuit compensating for the voltage outputted from said BiCMOS logical circuit by a drop in potential;

said each select signal output circuit having said BiCMOS logical circuit as said power supply circuit and said compensating circuit, said compensating circuit comprising an inverter, a delay circuit and serially connected first and second P-channel transistors, an output terminal of said BiCMOS logical circuit being connected to said section select line, an input terminal of so said inverter and an input terminal of said delay circuit, an output terminal of said inverter being connected to the gate of said first P-channel transistor, an output terminal of said delay circuit being connected to the gate of said second P-channel transistor, the source of said first P-channel transistor being applied with a power source voltage, and the drain of said second P-channel transistor being connected to said section select line.

7. A semiconductor memory device according to claim 6, wherein said delay circuit includes a plurality of serially connected inverters.

8. A semiconductor memory device comprising:

a plurality of cell array sections, each having a plurality of memory cells disposed in a matrix form, said plurality of cell array sections being juxtaposed in a row direction;

main word lines, each provided in common for all of said plurality of cell array sections at each row, a row select signal being applied to each said man word line;

section word lines connected to said memory cells in each said cell array section at each row, for activating said memory cells;

section select lines provided for each said cell array section, a section selection signal being applied to each said section select line;

logical circuits provided for each said cell array section, each said logical circuit being connected to each said main word line and said section select line, said logical circuits executing a logical operation between said row select signal and said section select signal, and activating said section select line when said logical operation result satisfies a predetermined logical condition, each said logical circuit including a first inverter, a CMOS type second inverter and an N-channel transistor, each said main word line being connected to the input terminals of said first and second converters, each said section select line being connected to the drain of said N-channel transistor and the source of a P-channel transistor of said second inverter, the gate of said N-channel transistor being connected to the output terminal of said first inverter, and each said section word line being connected to the source of said N-channel transistor and the output terminal of said second inverter;

bit lines connected to each memory cell for receiving data from a selected memory cell and outputting said data; and a plurality of section select signal output circuits for outputting said select signal to each said section select line, said each section select signal output circuit comprising a power supply circuit with a high driving capacity, said power supply circuit being a BiCMOS logical circuit, and further including a compensating circuit for compensating for voltage outputted from said BiCMOS logical circuit by fall of potential;

wherein said each section select signal output circuit having said BiCMOS logical circuit as said power supply circuit, and said compensating circuit, said compensating circuit comprising a delay circuit, a second logical circuit and a P-channel transistor, an output terminal of said BiCMOS logical circuit being connected to said section select line, an input terminal of said delay circuit, the drain of said P-channel transistor and a first input terminal of said second logical circuit, an output of said delay circuit being connected to a second input terminal of said second logical circuit, an output terminal of said second logical circuit being connected to the gate of said P-channel transistor, and the source of said P-channel transistor being applied with a power source voltage.

9. A semiconductor memory device according to claim 8, wherein said delay circuit includes a plurality of serially connected inverters.

10. A semiconductor memory device according to claim 8, wherein said second logical circuit has a NAND operation function, and said delay circuit includes an even number of serially connected inverters.

11. A semiconductor memory device comprising:

a plurality of cell array sections, each having a plurality of memory cells disposed in a matrix form, said plurality of cell array sections being juxtaposed in a row direction;

main word lines, each provided in common for all of said plurality of cell array sections at each row, a row select signal being applied to each said main word line;

section word lines connected to said memory cells in each said cell array section at each row, for activating said memory cells;

section select lines provided for each said cell array section, a section selection signal being applied to each said section select line;

logical circuits provided for each said cell array section, each said logical circuit being disposed between a pair of cell array sections and connected to each said main word line and said section select line, said logical circuits executing a logical operation between said row select signal and said section select signal, and activating said section select line when said logical operation result satisfies a predetermined logical condition, each said logical circuit including a first inverter, a CMOS type second inverter and an N-channel transistor, each said main word line being connected to the input terminals of said first and second inverters, each said section select line being connected to the drain of said N-channel transistor and the source of a P-channel transistor of said second inverter, the gate of said N-channel transistor being connected to the output terminal of said first inverter, and each said section word line being connected to the source of said N-channel transistor and the output terminal-of said second inverter;

bit lines connected to each memory cell for receiving data from a selected memory cell and outputting said data; and a plurality of section select signal output circuits for outputting said section select signal to each said section select line, said each section select signal output circuit comprising (1) a power supply circuit with a high driving capacity, said power supply circuit being a BiCMOS logical circuit, and (2) a compensating circuit for compensating for a voltage outputted from said BiCMOS logical circuit by the value of a potential drop.

12. A semiconductor memory device according to claim 11, wherein said delay circuit includes a plurality of serially connected inverters.

13. A semiconductor memory device according to claim 11, wherein said second logical circuit has a NAND operation function, and said delay circuit includes an even number of serially connected-inverters.

*14. A semiconductor memory device comprising: a plurality of cell array sections, each having a plurality of memory cells disposed in a matrix form, said plurality of cell array sections being juxtaposed in a row direction; main word lines, each provided in common for all of said plurality of cell array sections at each row, a row select signal being applied to each said main word line; section word lines connected to said memory cells in each said cell array section at each row, for activating said memory cells; section select lines provided for each said cell array section, a section selection signal being applied to each said section select line; logical circuits provided for each said cell array section, said logical circuits executing a logical operation between said row select signal and said section select signal, and activating said section select line when said logical operation result satisfies a predetermined logical condition, each said logical circuit including a CMOS type inverter and an N-channel transistor, each said main word line being*

*connected to the input terminal of said inverter, each said section select line being connected to the drain of said N-channel transistor and the source of a P-channel transistor of said inverter, the rate of said N-channel transistor being supplied with an inverted signal which is complementary to the row select signal applied to each said main word line and each said section word line being connected to the source of said N-channel transistor and the output terminal of said inverter; bit lines connected to the memory cells for receiving data from a selected memory cell and outputting said data; and a plurality of section select signal output circuits for outputting said section select signal to each said section select line, said each section select signal output circuit having a power supply circuit comprising a switch to operably connect the section select signal to a power supply without any voltage drop.*

*15. A semiconductor memory device, as recited in claim 14, wherein the switch includes a transistor.*

*16. A semiconductor memory device, as recited in claim 14, further comprising a complementary signal line arranged in parallel to the main word line and connected to the logical circuits, the complementary signal line transferring the inverted signal.*

*17. A semiconductor memory device, as recited in claim 15, further comprising a common circuit connected to the complementary signal line for generating the inverted signal.*

*18. A semiconductor memory device, as recited in claim 14, wherein diffusion layers of said inverter and said N-channel transistor are used in common.*

*19. A semiconductor memory device comprising: a plurality of cell array sections, each having a plurality of memory cells disposed in a matrix form, said plurality of cell array sections being juxtaposed in a row direction; main word lines, each provided in common for all of said plurality of cell array sections at each row, a row select signal being applied to each said main word line; section word lines connected to said memory cells in each said cell array section at each row, for activating said memory cells; section select lines provided for each said cell array section, a section selection signal being applied to each said section select line; logical circuits provided for each said cell array section, said logical circuits executing a logical operation between said row select signal and said section select signal, and activating said section select line when said logical operation result satisfies a predetermined logical condition, each said logical circuit including a CMOS type inverter and an N-channel transistor, each said main word line being connected to the input terminal of said inverter, each said section select line being connected to the drain of said N-channel transistor and the source of a P-channel transistor of said inverter, the gate of said N-channel transistor being supplied with an inverted signal which is complementary to the row select signal applied to each said main word line and each said section word line being connected to the source of said N-channel transistor and the output terminal of said inverter; bit lines connected to the memory cells for receiving data from a selected memory cell and outputting said data; and a plurality of section select signal output circuits for outputting said section select signal to each said section select line, said each section select signal output circuit having connecting means for connecting the section select line and a power supply without any voltage drop.*

*20. A semiconductor memory device, as recited in claim 19, wherein the connection means includes a transistor.*

* * * * *